United States Patent
Ishida et al.

(10) Patent No.: US 7,357,546 B2
(45) Date of Patent: Apr. 15, 2008

(54) VEHICULAR HEADLAMP EMPLOYING SEMICONDUCTOR LIGHT-EMITTING ELEMENT HAVING IMPROVED LIGHT DISTRIBUTION

(75) Inventors: Hiroyuki Ishida, Shizuoka (JP); Masashi Tatsukawa, Shizuoka (JP); Akinori Matsumoto, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 330 days.

(21) Appl. No.: 10/699,815

(22) Filed: Nov. 4, 2003

(65) Prior Publication Data

US 2004/0136202 A1      Jul. 15, 2004

(30) Foreign Application Priority Data

Nov. 6, 2002    (JP)    ............................ P.2002-322651

(51) Int. Cl.
*F21V 7/00* (2006.01)
(52) U.S. Cl. .................. 362/545; 362/516; 362/343
(58) Field of Classification Search ................ 362/460, 362/507, 509, 544, 545, 546, 800, 514, 516, 362/247, 249, 341, 347, 343
See application file for complete search history.

(56) References Cited

U.S. PATENT DOCUMENTS

| | | | | |
|---|---|---|---|---|
| 1,576,035 A | * | 3/1926 | Cipperly | ..................... 362/509 |
| 4,575,787 A | * | 3/1986 | Birt | ............................. 362/297 |
| 4,868,726 A | * | 9/1989 | Segoshi | ....................... 362/308 |
| 4,935,665 A | * | 6/1990 | Murata | ........................ 313/500 |
| 5,136,483 A | | 8/1992 | Schöniger | |
| 5,199,779 A | * | 4/1993 | Sato | ........................... 362/538 |
| 5,477,436 A | | 12/1995 | Bertling et al. | |
| 5,813,753 A | * | 9/1998 | Vriens et al. | ............... 362/293 |
| 5,975,730 A | * | 11/1999 | Neumann et al. | .......... 362/509 |
| 6,406,172 B1 | * | 6/2002 | Harbers et al. | ............. 362/544 |
| 6,419,381 B2 | * | 7/2002 | Nino et al. | .................. 362/518 |
| 6,471,383 B1 | * | 10/2002 | Oyama et al. | .............. 362/517 |
| 6,565,247 B2 | | 5/2003 | Thominet | |
| 6,619,825 B2 | * | 9/2003 | Natsume | ..................... 362/509 |
| 6,637,922 B2 | * | 10/2003 | Lee | ............................. 362/544 |
| 2001/0019486 A1 | * | 9/2001 | Thominet | .................... 362/543 |
| 2002/0079506 A1 | | 6/2002 | Komoto et al. | |
| 2003/0007364 A1 | * | 1/2003 | Nakata | ....................... 362/514 |
| 2004/0056263 A1 | | 3/2004 | Baur et al. | |

FOREIGN PATENT DOCUMENTS

| | | |
|---|---|---|
| EP | 0 416 253 A2 | 3/1991 |
| GB | 2 287 308 A | 9/1995 |
| WO | WO 01/01038 A | 1/2001 |
| WO | WO 01/59360 A1 | 8/2001 |
| WO | WO 02/15287 A | 2/2002 |

* cited by examiner

*Primary Examiner*—Thomas M. Sember
(74) *Attorney, Agent, or Firm*—Sughrue Mion, PLLC

(57) ABSTRACT

A vehicular headlamp employing a light-emitting element such as an LED and having an improved projected light pattern. A light-emitting surface of a light-emitting system has a horizontally elongated shape when viewed in a direction orthogonal to the optical axis of the light-emitting system so as to form a light distribution pattern which is enlarged through an optical system mainly in the horizontal direction. Since the projected pattern is obtained by enlarging the horizontally elongated light source image, it is easier to design the light distribution of the lamp in comparison to a case where the light intensity distribution of the light-emitting system is rotationally symmetric.

10 Claims, 13 Drawing Sheets

VEHICULAR HEADLAMP EMPLOYING SEMICONDUCTOR LIGHT-EMITTING ELEMENT HAVING IMPROVED LIGHT DISTRIBUTION

CROSS-REFERENCE TO RELATED APPLICATIONS

Not applicable

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISK APPENDIX

Not applicable

BACKGROUND OF THE INVENTION

The present invention relates to a vehicular headlamp employing a semiconductor light-emitting element such as a light-emitting diode as a light source and which has an improved light distribution.

An incandescent bulb or a discharge bulb has often been used as a light source of a vehicular headlamp. However, recently attention has been given to a light-emitting element such as a light-emitting diode (LED) for use as a light source of a vehicular headlamp so as to achieve lower power consumption and a more compact size.

Vehicular lamps other than headlamps using LEDs include high-mount stop lamps, rear side marker lamps, and the like.

When a semiconductor type light-emitting element such as a LED is used as a light source of a vehicular headlamp, it is necessary to employ different optical design techniques than in the case of an incandescent or discharge bulb in order to obtain the desired light distribution pattern for the low beam of the headlamp. For example, in a lamp employing for its light source a large number of semiconductor light sources arranged in a matrix configuration, switching may be employed to select from among multiple optical functions. (See, for example, Japanese Laid-Open Patent Application No. 2001-266620, FIGS. 1 and 4.)

When an LED is used having a rotationally symmetric light output with respect to the optical axis, precise optical design of the reflecting surface of the lamp's reflector or of lens steps in the front lens is required in order to obtain a light distribution, such as that needed for a headlamp, that is not rotationally symmetric. For designing lamps using semiconductor light-emitting elements, a method is known whereby modeling of the internal structure of the semiconductor element is performed, and the form of the lens steps is modified based on simulation results of light ray tracing or light distribution. (See, for example, Japanese Laid-Open Patent Application No. 7-225790, FIG. 11.)

However, there is a problem concerning the formation of a desired headlamp light distribution since the pattern of light emitted by a conventional light-emitting system has a substantially circular shape when viewed in the direction of the optical axis. For example, in the case of low-beam light, it is difficult to obtain a clear cut line (or cut-off line) that defines a constant boundary.

BRIEF SUMMARY OF THE INVENTION

Therefore, it is an object of the present invention to provide a vehicular headlamp using light-emitting elements such as LEDs for a light source and having an improved and simplified optical design.

According to the present invention, a vehicular headlamp employing semiconductor light-emitting elements as a light source and having an optical system including a reflector or a lens is configured as described below. A light-emitting system may be provided with one or more semiconductor chips. There may also be provided a reflector, a fluorescent body and a lens. The light-emitting surface of the light-emitting system is formed by the surface portion of the semiconductor chip from which light emanates, and, if present, the surface portions of the reflector and fluorescent body which respectively reflect or emit light.

The focal point of the optical system (the focal point of the reflector or the object-side focal point of the lens, etc.) is set at or in the vicinity of the light-emitting surface of the light-emitting system.

The light-emitting surface of the light-emitting system has a horizontally elongated shape in the direction orthogonal to the optical axis when viewed in the direction of the optical axis of the light-emitting element.

Therefore, according to the present invention, since the light source image from the light-emitting surface having a horizontally elongated shape when viewed in the direction of the optical axis of the light-emitting system is used, the necessity of a complicated optical design requiring distribution control by the optical system, as is the case when the light distribution is rotationally symmetric, is eliminated.

DETAILED DESCRIPTION OF THE INVENTION

The present invention relates to a vehicular headlamp using a semiconductor light-emitting element as a light source, and is applicable to headlamps, fog lamps, etc. The semiconductor light-emitting element may be, for example, an LED that emits light in response to an electric current flowing through a pn junction in the forward direction, or an EL element that emits light in response to an applied electric field.

Figure 1:
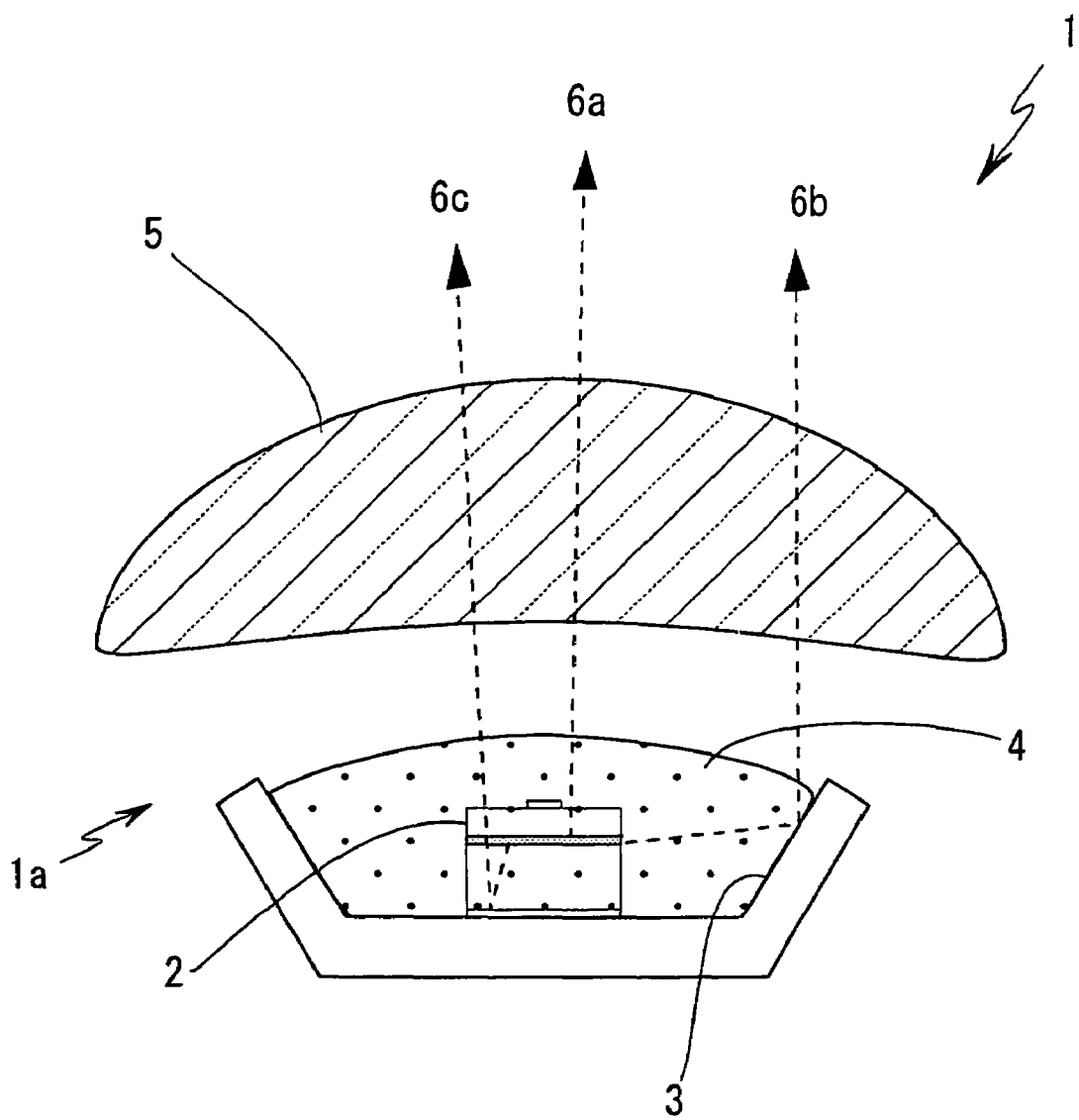
FIG. 1 is a cross-sectional explanatory view showing an example of the configuration of a light-emitting system of a type which may be used with the invention.

FIG. 1 schematically shows the structure of an LED as an example.

A light-emitting system 1 is provided with a semiconductor chip 2, a reflector 3, a fluorescent body 4 and a lens 5. In this example, a light-emitting surface 1a is formed by those surfaces of the semiconductor chip 2, the reflector 3, and the fluorescent body 4 which emit or reflect light. The focal point of an accompanying optical system is set at or in the vicinity of the light-emitting surface. The "focal point" as used herein is not limited to the physically defined focal point of a reflector or a lens, but more broadly includes a data point or the like for optical form design.

The semiconductor chip 2 is made of Al-In-Ga-P system material, In-Ga-N system material, or the like. As shown in FIG. 1, the semiconductor chip 2 can be directly mounted on a supporting member (lead frame, stem, etc.), or it can be mounted on a sub-mount member and the sub-mount member then mounted on the supporting member. Bonding wires (not shown in the drawing) are connected to respective electrodes provided on the semiconductor chip 2.

A reflector 3 is formed in a member provided in the vicinity of the semiconductor chip 2. For instance, the supporting member of the semiconductor chip 2 can have a cup-shaped portion on which a concave face is formed, thus forming a reflecting surface. Light emitted from the semiconductor chip 2 has an orientation characteristic centered on the optical axis of the light-emitting system. Thus, for a given distance from the semiconductor chip 2, the further an observation point is from the optical axis, the less the light intensity. Therefore, as shown in FIG. 1, between direct light 6a and reflected light 6b and 6c, the direct light in the optical axis direction is most intense. However, the reflector 3 is provided to effectively use light emitted toward the sides of the semiconductor chip such as light 6b. That is, light is reflected from the reflecting surface of the reflector 3 and directed forward (in the illumination direction). Light 6c, emitted from the rear surface of a light-emitting layer of the semiconductor chip 2, is initially directed in the direction opposite to the illumination direction. However, light 6c is directed forward upon being reflected from the reflector 3.

Alternatively, the light 6c can be radiated from a side face of the semiconductor chip 2 and reflected by the reflector 3 after being reflected from the rear surface of the semiconductor chip 2.

The fluorescent body 4 covers the semiconductor chip 2 and fills the surrounding space. It is possible to obtain white light by, for example, mixing blue light emitted from the semiconductor chip 2 and yellow light emitted from a material such as a YAG fluorescent body.

The lens 5 is arranged forward of the semiconductor chip 2. Otherwise, the light-emitting surface 1a can be enveloped in a plastic lens. In the latter case, the orientation characteristic can be improved by enveloping the entire light-emitting surface in the plastic material. For example, a bullet-shaped lens used as a stop lamp or the like is known. A lens having a dome or hemispherical shape is preferable to prevent light emitted at a wide angle from the semiconductor chip 2 from being reflected inside the lens, and also to prevent light emitted from the sides of the lens from being lost. Generally, efficient use of the available light output from the semiconductor chip should be achieved through effective light path control using reflecting surfaces as appropriate.

If a light source image of the light-emitting surface has a circular shape when viewed in the direction of the optical axis of the light-emitting system, most of the light emitted from the light-emitting surface is direct light and contributes to the formation of the circular pattern. Further, a ring pattern located around the circular pattern is formed by light emitted from the sides of the lens, appearing thus as a pseudo light source.

However, if the intensity distribution of the light source is rotationally symmetric around the optical axis, since it is necessary to form a rotationally asymmetric light distribution pattern based on the substantially circular pattern when viewed in the direction of the optical axis, optical design is generally difficult. For instance, it is difficult to form a straight portion such as a cut line in a low-beam light distribution pattern (merely connecting arc portions cannot form a clear straight portion).

Therefore, in a case where the light intensity distribution of the light-emitting system is rotationally asymmetric around the optical axis, a structure is provided such that the light-emitting surface has a horizontally elongated shape along a direction orthogonal to the optical axis of the light-emitting system, and thus the projected image through the optical system has a pattern shape with a straight portion.

Figure 2:
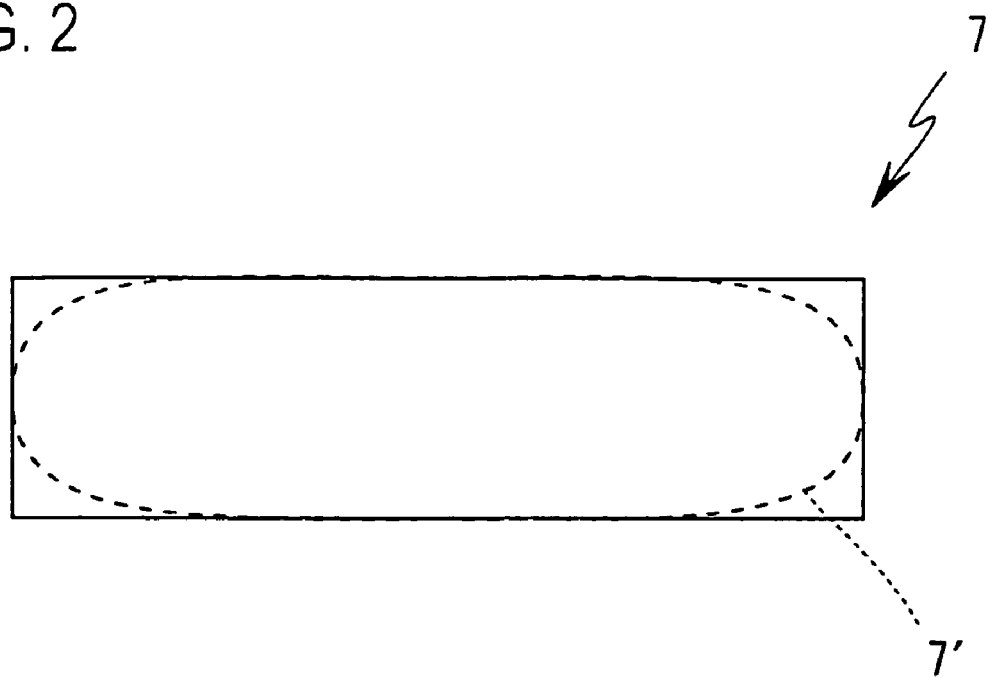
FIG. 2 is a diagram showing an example of a rectangular light pattern produced by the light-emitting system.

FIG. 2 schematically shows an example of a pattern shape of a light source image of the light-emitting system when viewed in the direction of the optical axis of the light-emitting system.

This case illustrates the pattern shape of a light source image 7 where the outer periphery of the actual light source has a substantially rectangular shape.

More specifically, this example illustrates the shape of the light-emitting surface 1a when viewed in the direction of the optical axis as being rectangular, and the light source image is enlarged mainly in the longitudinal direction, as described below.

To obtain a horizontally elongated projected pattern, it is preferable to use a rectangular light source image rather than a square one. The shape of the light source image is not restricted to one where the end portion in the longitudinal direction is straight. For example, a shape where the four corners are rounded, as in the light source image shown by a dashed line 7', is also possible.

To obtain the light source image described above, the semiconductor chip, the reflector, the fluorescent body, and/or the lens, namely, the members of which the light-emitting system is composed, are designed to have a shape so as to produce a light source image which is rotationally asymmetric around the optical axis of the light-emitting system. In other words, the factors that determine the pattern shape of the light source image are the shape of the semiconductor chip, the shapes of the reflector or the fluorescent body, the shape and the material of the lens, and the optical and positional relationship among these components. Accordingly, it is possible to design a light-emitting system that has a desired light source image, employing simulation results using a combination of these elements (light ray tracing and light intensity distribution).

A structure has been described in which the light-emitting surface has a desired shape, for example, a rectangle, when viewed in the direction of the optical axis, and the light-emitting surface is covered with a semi-cylindrical plastic lens. However, designing the semiconductor chip to have a certain shape causes various technical difficulties and disadvantages in terms of manufacturing cost. On the other hand, designing the shape of the reflector or the fluorescent body is also effective to achieve the objects of the invention, as shall be described below.

By designing the shape of the reflector 3 such that it is rotationally asymmetric around the optical axis and has a shape appropriate for light distribution for the lamp, the light intensity distribution can be changed appropriately without significant changes in the shape or the orientation of the semiconductor chip.

Figure 3:
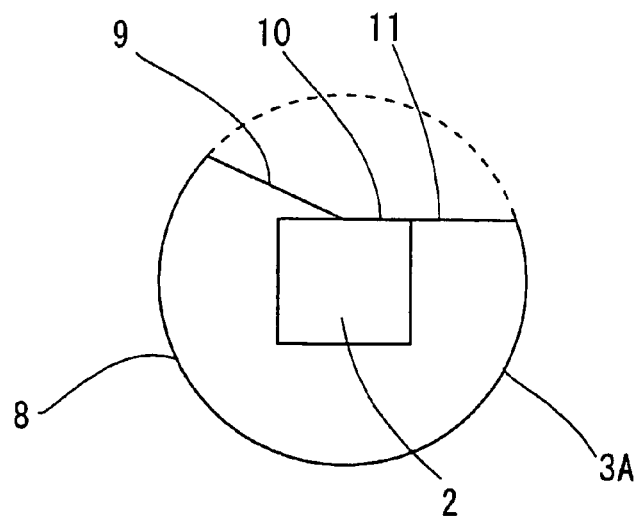
FIG. 3 is an explanatory diagram showing an example of the shape of a reflector and a semiconductor chip of the light-emitting system when viewed in the direction of the optical axis.
Figure 4:
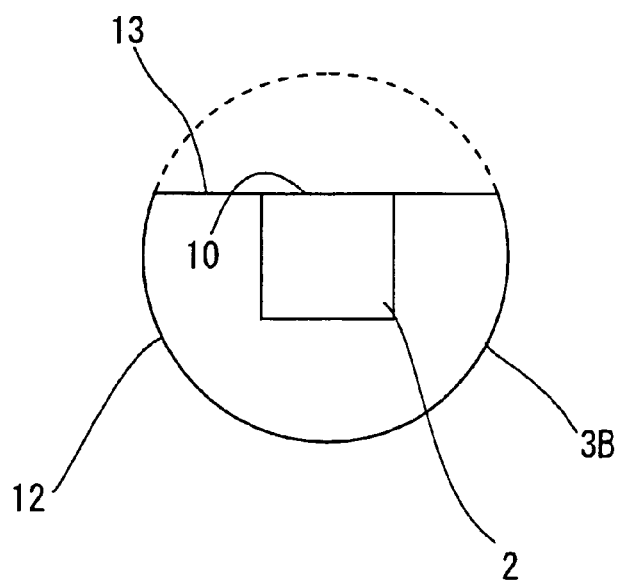
FIG. 4 is an explanatory diagram showing another example of the shape of the reflector and the semiconductor chip when viewed in the direction of the optical axis.

FIGS. 3 and 4 illustrate schematically examples of a semiconductor chip and reflector when viewed in the direction of the optical axis of the light-emitting system. The semiconductor chip 2 in both cases has a square shape.

A reflector 3A in FIG. 3 has a substantially sector-like form having a central portion 8, an outer peripheral edge of which forms an arc, and a portion 9 whose upper edge is defined by a bent line. When viewed in the direction of the optical axis, a side 10 (upper side in the figure) of the semiconductor chip 2 substantially corresponds to a horizontally extending part 11 of the bent line. In other words, the reflector 3A has a shape resembling the remainder of a complete circle after an area indicated by a dashed line is cut off.

In this example, it is possible to obtain a light source image suitable for forming a light pattern having a horizontal cut line, or a cut line inclined with respect to the horizontal cut line, as is required for forming a headlamp low-beam pattern.

A reflector 3B in FIG. 4 has a central portion 12 whose outer peripheral edge has an arc shape and a portion 13 whose upper edge is defined by a straight line. When viewed in the direction of the optical axis, the side 10 (upper side in the figure) of the semiconductor chip 2 substantially corresponds to the upper, straight-line edge of the portion 13. That is, the reflector 3B has a shape resembling the remainder of a complete circle after an area indicated by a dashed line is cut off.

In the foregoing example, it is thus possible to obtain a light source image preferable for forming a horizontal cut line in a low-beam light distribution pattern.

As mentioned above, it is possible to obtain a light source image effective for forming a clear cut line by appropriately designing the cup-shaped reflector such that it has a rotationally asymmetric shape when viewed in the direction of the optical axis, taking into consideration the desired light distribution pattern of the headlamp.

Further, the degree of design freedom is further improved by making the shape of the fluorescent body 4 when viewed in the direction of the optical axis correspond to the shapes of the reflectors 3A, 3B, or another desired shape.

Moreover, since direct light from the semiconductor chip 2 and light reflected by the reflector 3, etc., are radiated outward through the lens 5, it is also possible to combine the selection of the refractive index of the component materials of the lens and the design of the shape of the refraction boundary to achieve the desired light distribution pattern. For instance, for the lens 5, it is preferable to make the shape of the lens surface having a lensing function rotationally symmetric (although generally not spherical).

As mentioned above, a desired light source image of the light-emitting system can be obtained by appropriately designing the component elements of the light-emitting system.

Figure 5:
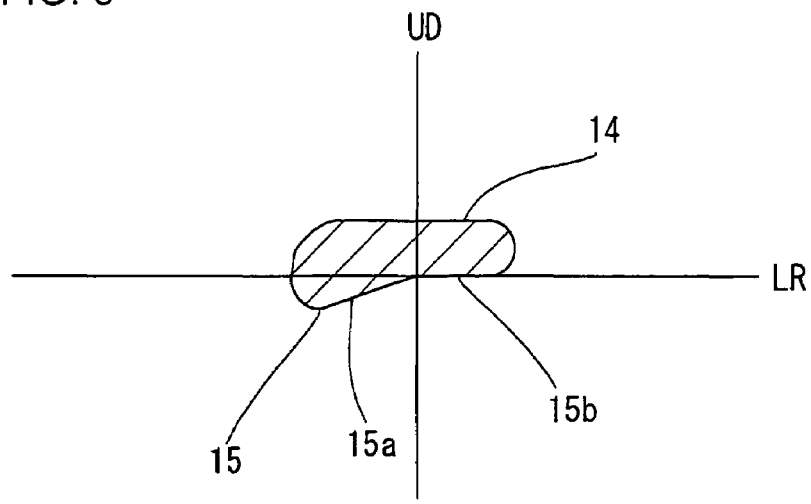
FIG. 5 is a diagram schematically showing an example of the shape of a light pattern produced by a light source that contributes to the formation of a cut line.

FIG. 5 shows an example of the light source image 14 of the light-emitting surface. The axis UD in the drawing extends vertically, while the axis LR extends horizontally.

As shown in the drawing, a side edge portion 15 in the longitudinal direction has a shape analogous to a cut line that is specific to a low-beam. In other words, of the side edges located to the left of the axis UD and below the axis LR, a portion 15a that extends leftward at an angle corresponds to an inclined cut line of the light distribution pattern. Also, a side edge located to the right of the axis UD and below the axis LR, that is, a portion 15b that extends laterally, corresponds to a horizontal cut line of the light distribution pattern.

A variety of shapes can be obtained by combining some of the projected patterns of a light source image that is rotationally asymmetric with respect to the optical axis. For example, a pattern such as the light source image 14 can be obtained by combining two rectangular patterns. However, it is important to be able to obtain a light source image appropriate for the formation of the cut line using only one light-emitting system in terms of the ease of optical design of the low-beam light distribution. In other words, designing the reflector or the lens of the optical system becomes significantly easier if the pattern shape of the light source is designed taking the light distribution pattern into consideration from the beginning.

In this way, the design freedom of the lamp can be improved by employing light-emitting system which produce a light source image that is appropriate for an automotive headlamp beam pattern, and combining light-emitting elements according to the application at hand. Especially the design freedom is improved compared with the case of using only light-emitting system having a light source image with a given shape.

An explanation is given below concerning the light source image of a light-emitting system appropriate for the formation of a projection light image pattern, using as an example a case where the light distribution pattern provided by the optical system is formed by combination of a condensed projected pattern and a diffusive projected pattern.

Figure 6:
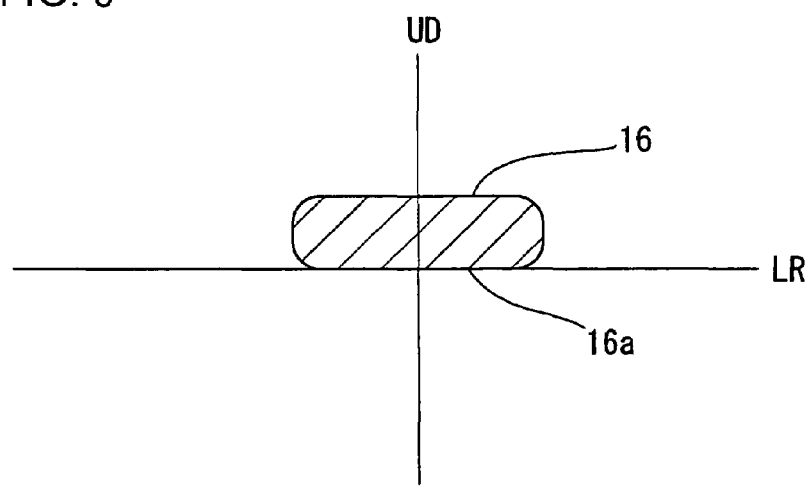
FIG. 6 is a diagram schematically showing an example of the shape of a light pattern produced by a light source that contributes to the formation of a less condensed or diffusive projected pattern.

FIG. 6 shows an example of a light source image used for forming a less condensed or laterally diffusive projected pattern. UD and LR have the same meaning as explained with respect to FIG. 5 (the same also applies to FIG. 7).

A light source image 16 in this example is substantially rectangular, extending in the direction of the axis LR, and a side 16a (lower side in the figure) corresponds to the axis LR.

Figure 7:
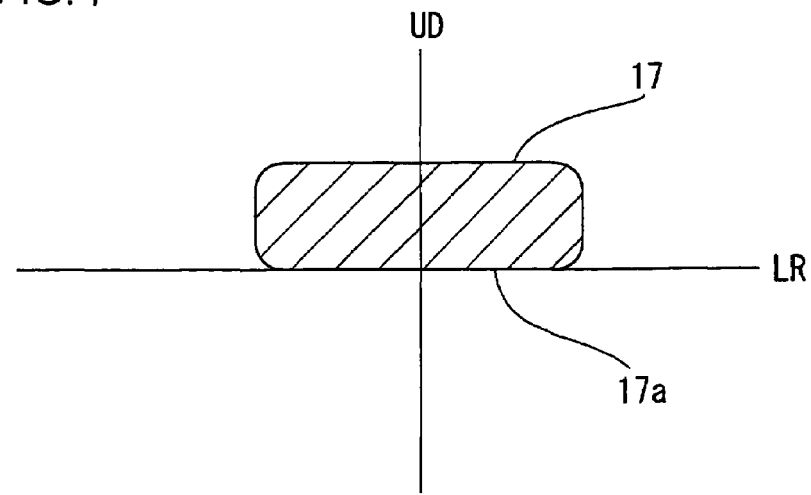
FIG. 7 is a diagram schematically showing an example of the shape of a light pattern produced by a light source that contributes to the formation of a diffusive projected pattern with a moderate or large diffusive characteristic.

FIG. 7 shows an example of a light source image 17 used for forming a projected pattern that has a moderate or large degree horizontal diffusive characteristic.

In this example too the light source image 17 is substantially rectangular, extending in the direction of the axis LR, and a side 17a (lower side in the figure) corresponds to the axis LR. However, when compared to the light source image 16, the widths in the directions of the axes LR and UD are increased.

As shown in FIGS. 5 to 7, by using light-emitting system that have a separate light source image according to the function, projected patterns appropriate for a cut line of a low-beam light distribution, a hot zone (a light intensity center portion), a moderate degree diffusive area, and a large degree diffusive area are combined, and a desired light distribution can be obtained.

Figure 8:
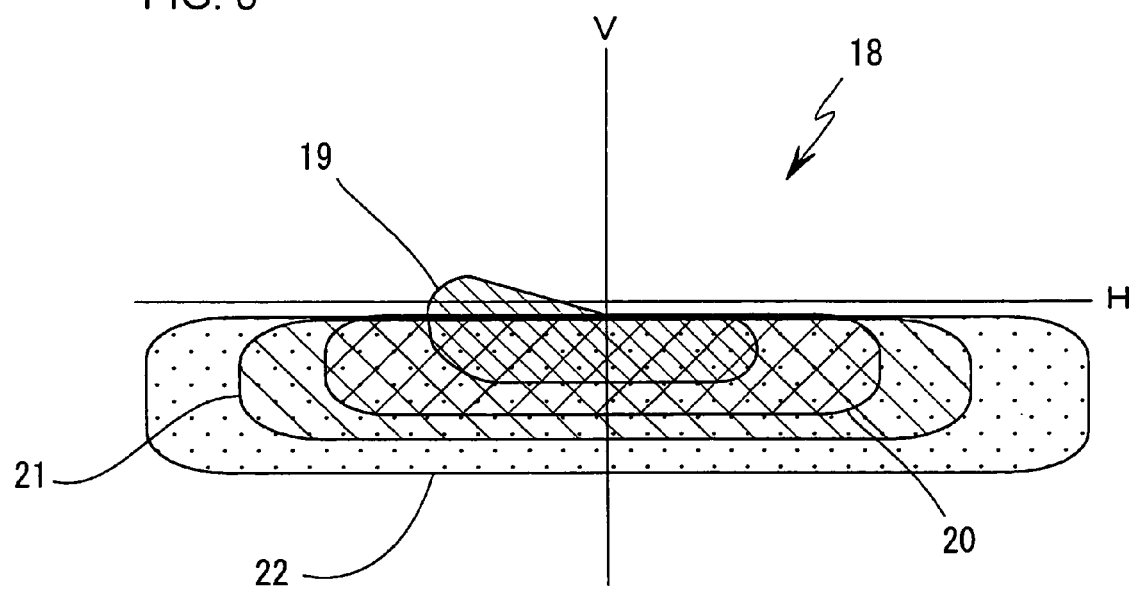
FIG. 8 schematically shows a light distribution pattern produced by a headlamp of the invention.

FIG. 8 shows a schematic example of the light distribution pattern that is obtained by separating the patterns into four according to functions and combining them. H refers to a horizontal line, while V refers to a vertical line.

In this example, a light distribution pattern 18 is formed by the following patterns:
 a projected pattern (19) that contributes principally to the formation of a cut line, and
 three diffusive projected patterns (20, 21, 22).

These patterns are formed as a collection of the projected images where the light source image of each light-emitting system extends mainly laterally. Among the projected patterns 20, 21 and 22, the pattern 20 has the smallest diffusive characteristic, the pattern 21 has a diffusive characteristic of moderate degree, and the pattern 22 has the largest diffusive characteristic. Two or more (four, for example) types of light-emitting system are used.

As described above, a preferable structure is such that a light-emitting system for forming the intensive projected pattern, a light-emitting system for forming the diffusive projected pattern, and a light-emitting system for forming the cut line are separately provided, and that each light source image has a different shape according to the light distribution function.

A structure in which a plurality of the light-emitting systems are used is not limited to a structure where one semiconductor chip is provided inside one light-emitting system. For example, as shown in FIGS. 9A/9B and 10A/10B (respectively a plane view from above and perspective view from below), a structure is possible where a plurality of semi-conductor chips are arranged inside the light-emitting system.

Figure 9A:
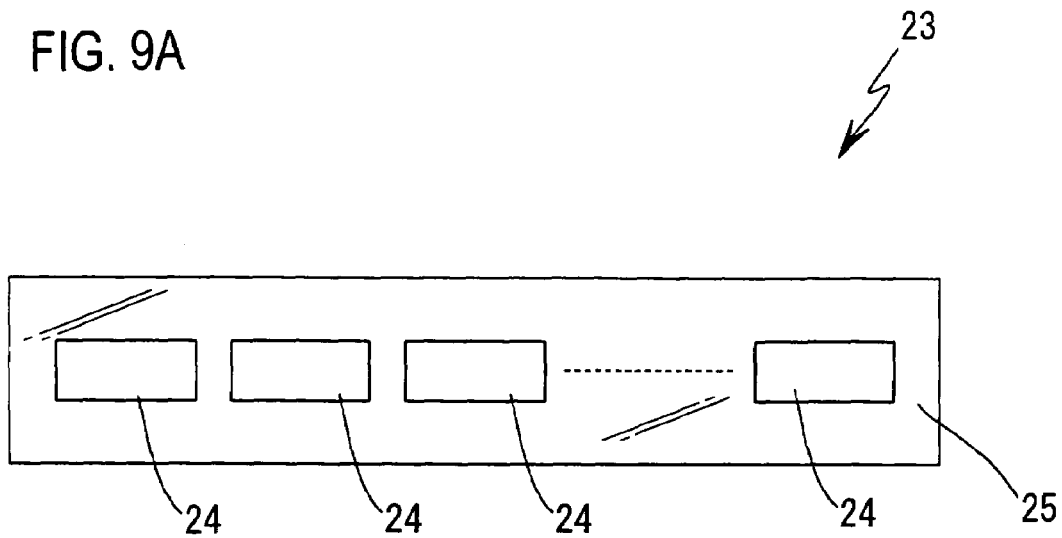
FIGS. 9A and 9B schematically show in planar and perspective views, respectively, a light-emitting system that has a plurality of semiconductor chips.
Figure 9B:
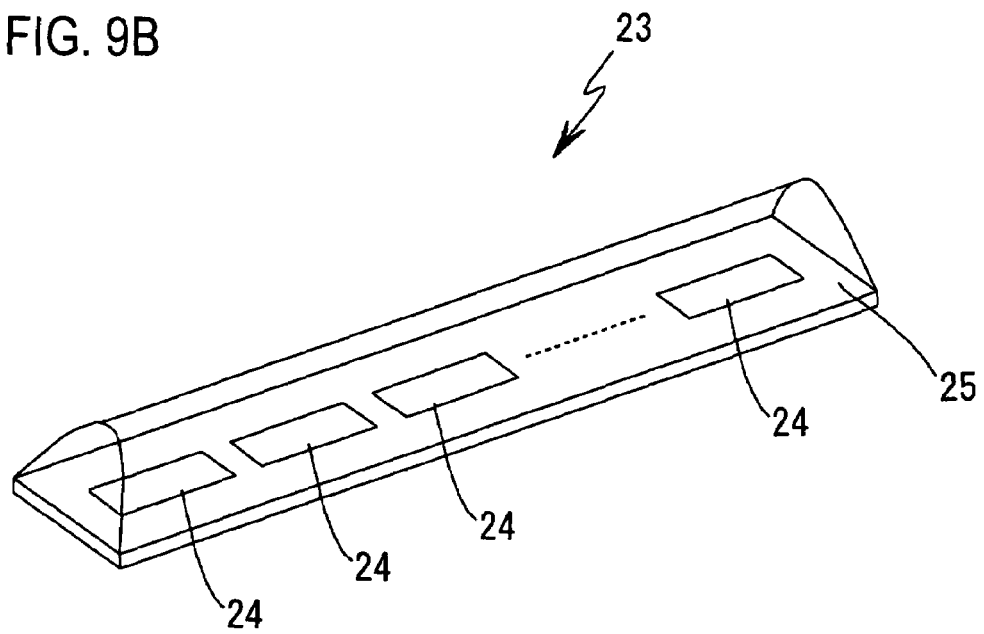

FIGS. 9A and 9B show an example of a structure where rectangular-shaped semiconductor chips 24 are arrayed in a given direction within a light-emitting system 23. A fluorescent body or a transparent member 25 that has a semi-cylindrical shape covers these semiconductor chips. Otherwise, the transparent member may be arranged forward of a base plate provided with each semiconductor chip.

In this example, the size of the light source can be reduced, and an advantage exists in that there is no need to use a special optical system for the light-emitting system. This is achieved by arranging a plurality of the semiconductor chips on a side face (a cylindrical face) of a cylindrical member (a base material) and using a semi-cylindrical fluorescent body or transparent member, in comparison to the case where the structure is similar to a filament shape (a cylindrical shape as an ideal).

Figure 10A:
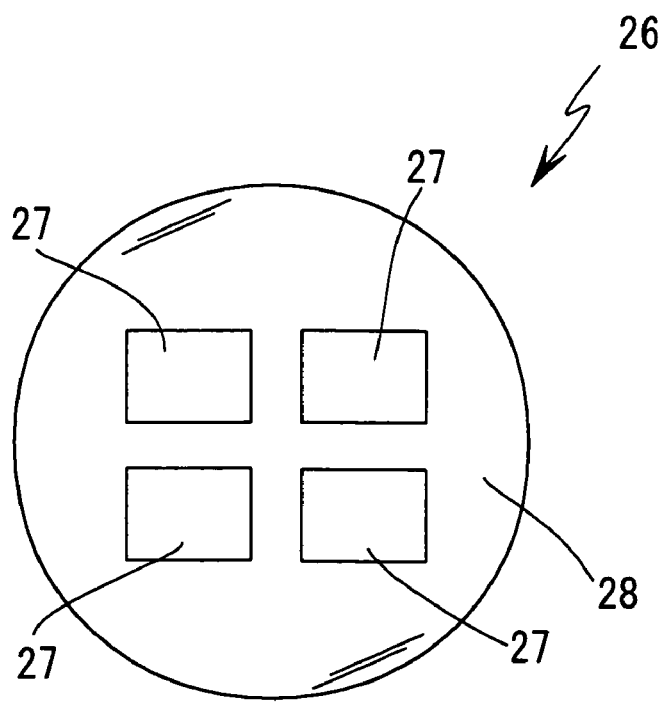
FIGS. 10A and 10B show in planar and perspective views, respectively, another example of a light-emitting system that has a plurality of semiconductor chips.
Figure 10B:
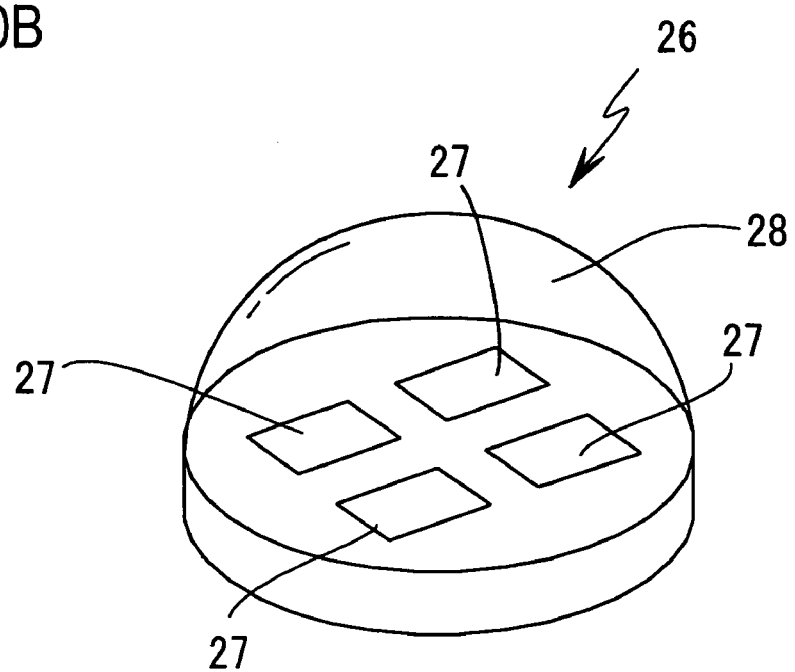

FIGS. 10A and 10B show an example of a structure where four rectangular semiconductor chips 27 are arranged inside a light-emitting system 26. In other words, a two-line, two-row arrangement where the center of each semiconductor chip is located at each corner of a square or a rectangle is formed. A fluorescent body or a transparent member 28 may cover these semiconductor chips, or the transparent member may be arranged forward of a base plate on which the semiconductor chips are mounted.

In either structure, a light intensity distribution that is rotationally asymmetric around the optical axis is obtained upon illuminating a selected plurality of or all of the semiconductor chips. For example, in a light distribution control type lamp in which the light distribution can be changed according to the operating conditions of a vehicle or the like, the necessary semiconductor chips are selectively illuminated according to the selected beam (low beam, main beam, etc.).

A problem can arise in the case where a plurality of semiconductor chips are provided inside a single light-emitting system since the bonding wires used for electrical connection of the semiconductor chips can block light from the semiconductor chips so that a shadow of dark stripes may appear in the light source image. To prevent this, it is preferable to select electrode positions such that, to the extent possible, the bonding wires do not block the forward direction (illumination direction) of the semiconductor chip, or to adopt a structure where the bonding wires can be connected at lateral edges or faces of the semiconductor chip.

Figure 11:
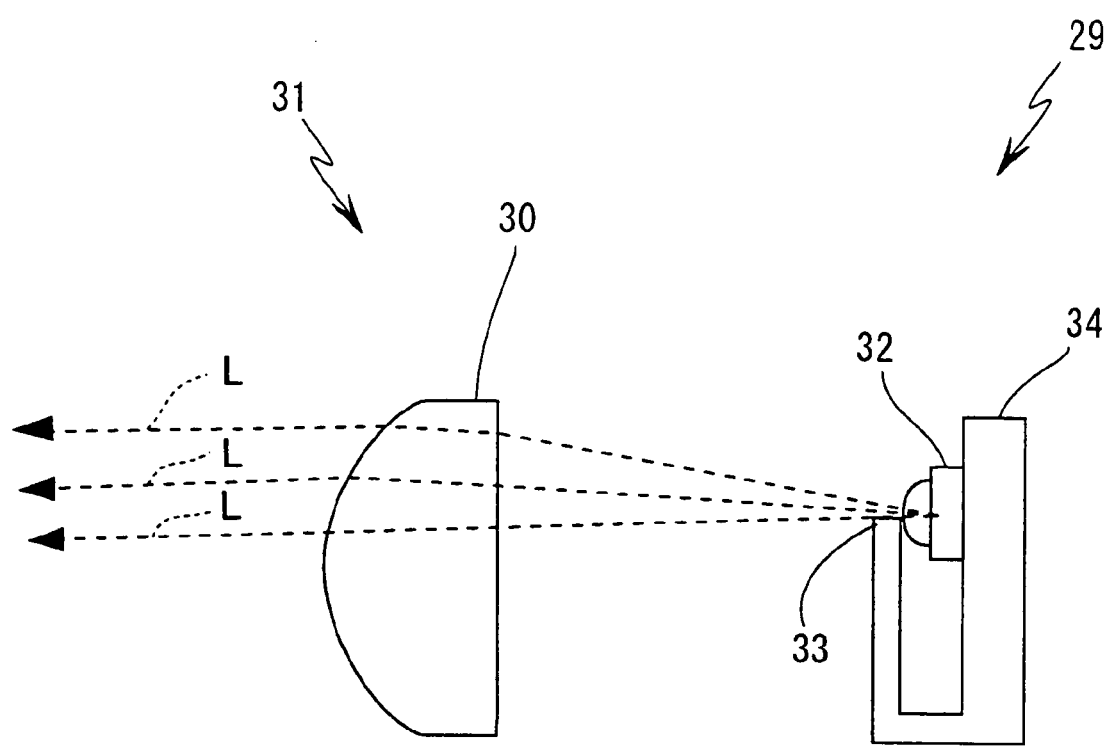
FIG. 11 is a diagram schematically showing an example of the configuration of a headlamp according to the present invention, where the configuration is such that direct light from the light-emitting system is used.
Figure 12:
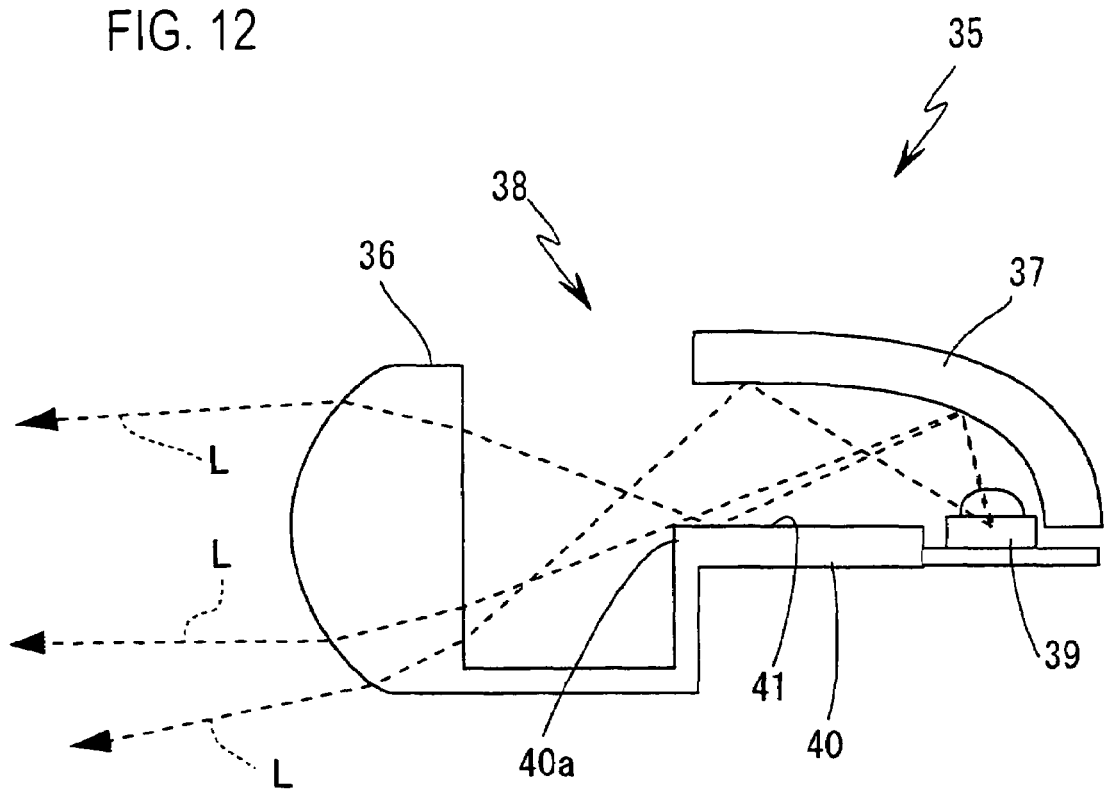
FIG. 12 is a view similar to FIG. 11 showing a configuration where reflected light is used.

FIGS. 11 and 12 show examples of structures of a vehicular headlamp constructed according to the present invention, especially a radiation portion (an illumination unit) of the vehicular headlamp. The structure uses a projection optical system having the following modes:
 (A) a mode where direct light from the light-emitting system is mainly used (FIG. 11), and
 (B) a mode where light reflected by the reflector is mainly used (FIG. 12).

In a vehicular lamp 29 as shown in FIG. 11, an optical system (a projection optical system) 31 including a projection lens 30 is used. That is, in this example, a structure is provided where a light-emitting system 32, a light-shielding member (shade) 33, and a projection lens 30 are provided, and the light-emitting system 32 and the light-shielding member 33 are mounted on a supporting member 34. Further, the object-side focal point of the projection lens 30 is set close to the upper edge of the light-shielding member 33. It is preferable to set the upper edge portion of the light-shielding member 33 as close to the light-emitting system 32 as possible for projecting the image formed by the partly shielded light from the light-emitting system 32 at the upper edge of the light-shielding member 33.

The optical axes of the light-emitting system 32 and the lamp are parallel. The output radiated light includes the light emitted by the light-emitting system, namely, the light directed forward as light 1 not blocked by the light-shielding member 33 located forward of the light-emitting system, and passing through the projection lens 30. A cut line defining a contrast boundary in the light distribution pattern is formed by the upper end of the light-shielding member 33. With this arrangement, the greater the radiation angle of the light emitted from the light-emitting system 32 the less light passes through the projection lens 30. Therefore, it is necessary to determine the radiation angle taking the diameter of the projection lens and its location into consideration.

In a vehicular headlamp 35 shown in FIG. 12, an optical system 38 including a projection lens 36 and a reflector 37 is used. That is, in this example, the lamp is provided with a light-emitting system 39, the reflector 37, and the projection lens 36, where a supporting member 40 for the light-emitting system 39 and the projection lens 36 is formed in a crank shape when viewed from the side, and a part of the supporting member serves as a light-shielding portion 40a. The focal point of the reflector 37 is set at or in the vicinity of the light-emitting surface of the light-emitting system 39, and an object-side focal point of the projection lens 36 is set in the vicinity of the light-shielding portion 40a.

The light-emitting system 39 is mounted on the supporting member 40 such that the optical axis thereof is orthogonal to the optical axis of the lamp. Most of the light emitted from the light-emitting system 30 is reflected from the reflecting surface of the reflector 37. After light directed forward without being blocked by the light-shielding portion 40a has passed through the projection lens, it becomes output radiated light. A cut line defining a contrast boundary in the light distribution pattern is formed by the upper edge of the light-shielding portion 40a. The light flux utility rate can be improved by providing a plane reflector 41 between the light-emitting system 39 and the light-shielding member 40a. It is possible to manufacture components of the optical system with greater accuracy regarding the mounting position of the light-emitting system 39, the upper edge position of the light-shielding member 40a, and the focal point of the projection lens 36, etc., by integrally forming the supporting member 40 and the projection lens 36 using a transparent material.

Figure 13:
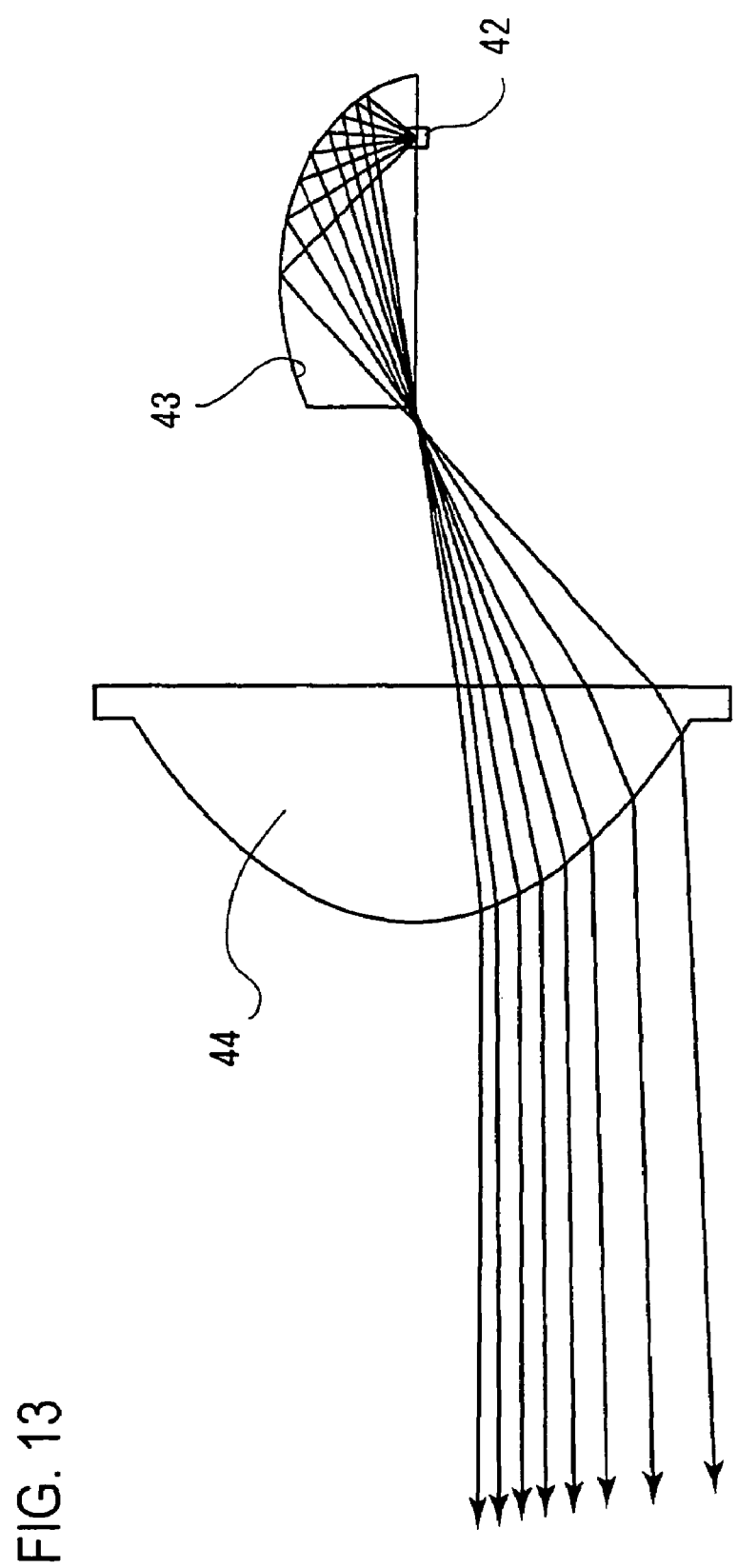
FIG. 13 is a vertical cross-sectional view showing an example of the optical arrangement of component elements of a headlamp of the invention.
Figure 14:
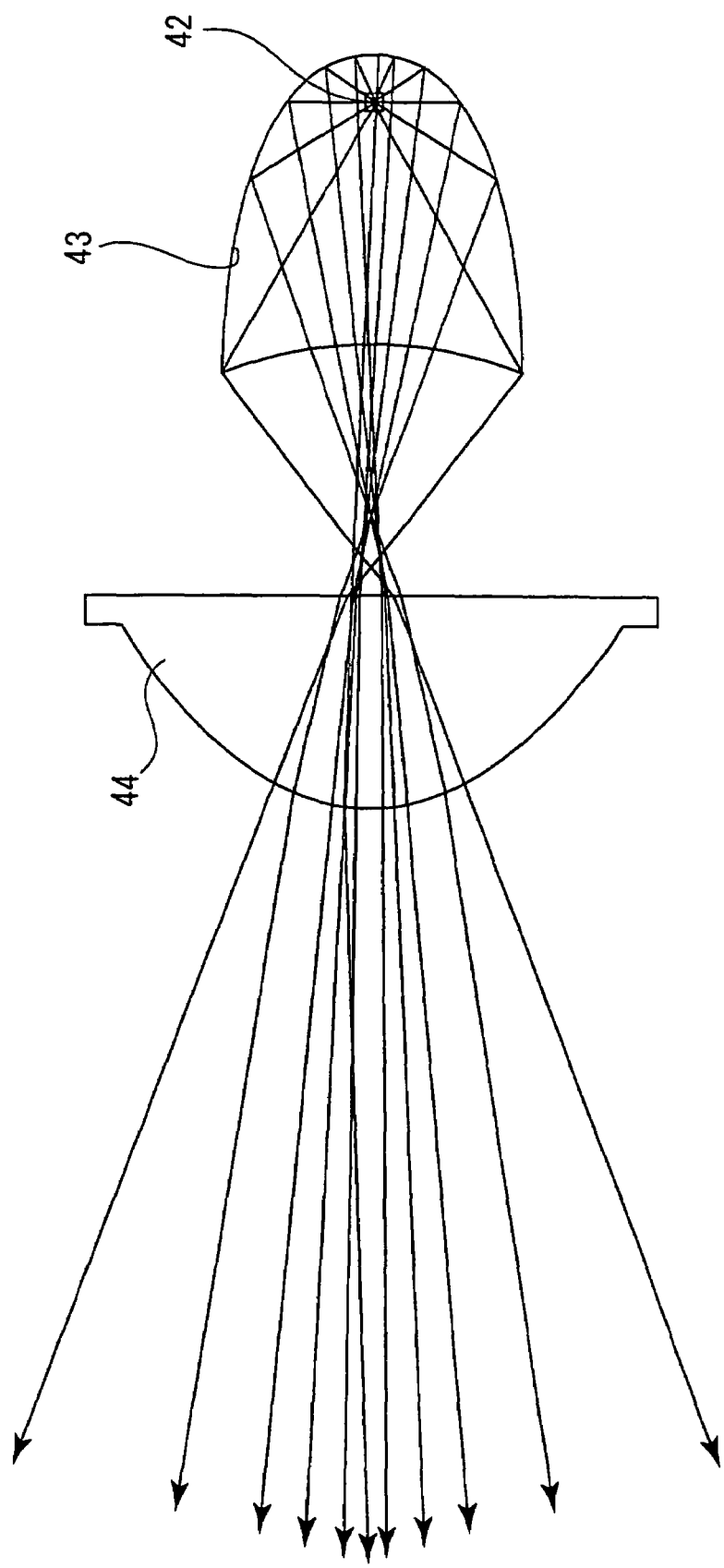
FIG. 14 is a horizontal cross-sectional view of the example of FIG. 13.
Figure 15:
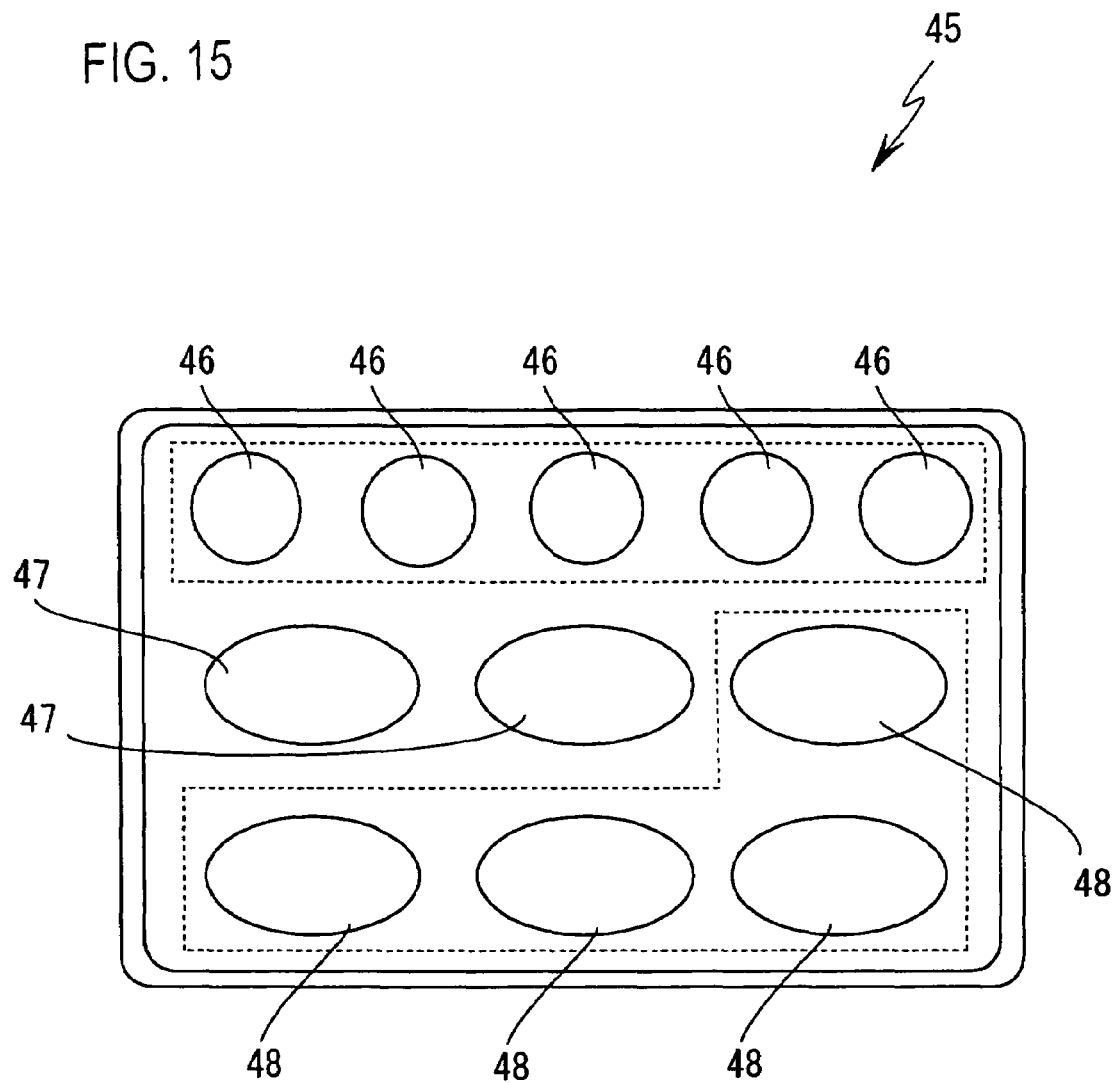
FIG. 15 is a front view showing the configuration of a headlamp of the invention.

FIGS. 13 and 14 show schematically examples of a lamp according to mode (B), showing the positional relationship of a light-emitting system 42, a reflecting surface 43, and a projection lens 44. FIG. 14 shows a vertical cross-sectional view, and FIG. 15 shows a lateral cross-sectional view. A light-shielding portion is not shown.

The shape of the reflecting surface 43 can be a rotational ellipsoid, an ellipsoid-parabolic composite, or a free-form surface, the degree of freedom of which is improved by an operation on the curved surface employing these base surfaces.

The light-emitting surface of the light-emitting system 42 has a horizontally elongated shape in the direction parallel to the optical axis of the lamp. A projected pattern corresponding to the reflecting position on the reflecting surface 43 is obtained by the light source image of the light-emitting surface being enlarged via the optical system. The light distribution pattern is formed by the combined projected patterns.

FIG. 15 is a front view showing schematically an example 45 of the configuration of a vehicular headlamp in which a plurality of illumination units are combined.

Illumination units 46 arranged in the top level are formed as diffusion types, with each being composed of an illumination unit having a horizontal diffusive characteristic of moderate degree and an illumination unit having a horizontal diffusive characteristic of large degree.

Illumination units located on the middle and lowermost levels are condensed types. Among them, illumination units 47 located on the middle level radiate a projected pattern that mainly contributes to the definition of a cut line. Remaining illumination units 48 are used to radiate light far forward of the vehicle, forming a projected pattern that mainly contributes to the formation of a hot zone.

All of these illumination units are configured as shown in FIG. 12, where the shapes of the light-emitting surface of the light-emitting system differ according to the light distribution function, and a focal point of the reflector, the light-shielding position, rear focus of the projection lens, etc., are designed according to specific purpose.

It is preferable that the number of the illumination units is a total of ten or between ten and twenty units when taking reduction of the size of the lamp and cost reduction into consideration. It is also preferred that two or so illumination units that contribute to the definition of a cut line be arranged in the center level of the lamp, and approximately two or three units for small diffusion, moderate diffusion and large diffusion are arranged respectively to the left and right of and above and below the center level of the lamp.

Figure 16:
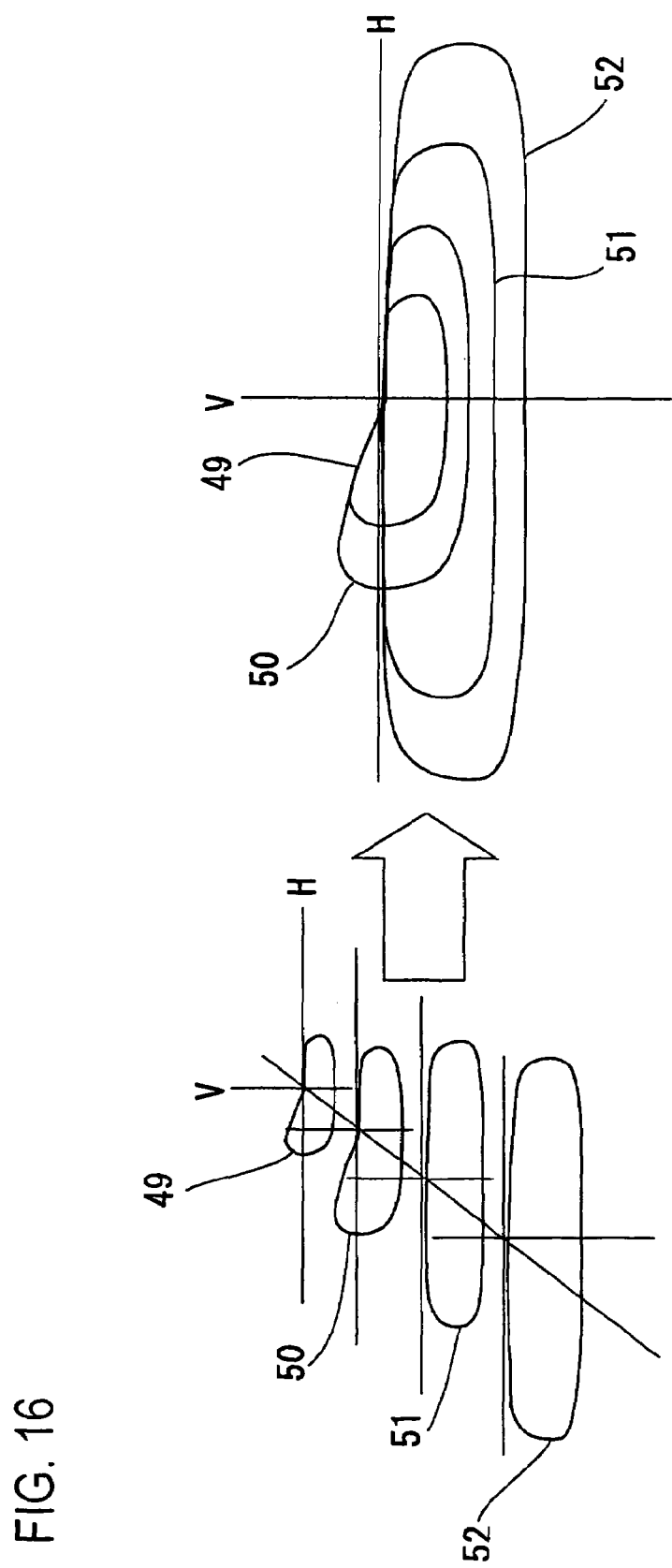
FIG. 16 shows an example of a light distribution pattern produced by a headlamp of the invention.

FIG. 16 schematically shows an example of the formation of a light distribution pattern, showing separate projected patterns on the left, and all the patterns combined on the right. The line H represents a horizontal line, and the line V represents a vertical line.

Of the condensed projected patterns 49, 50, the pattern 49, which has the smaller area, is formed by the illumination unit 48, while the pattern 50 is formed by the illumination unit 47.

Laterally diffusive projected patterns 51, 52 are formed by the illumination units 48, with the pattern 51 being formed by a diffusive illumination unit having a diffusive characteristic of moderate degree, while the pattern 52 is a formed by an illumination unit having a diffusive characteristic of large degree.

It is possible to form a definite cut line and improve the light flux utility rate by combining these projected patterns.

As evident from the above description, obtaining the desired light distribution pattern is easy with the use of the invention since the desired pattern can be obtained by enlarging with the optical system, mainly in the lateral direction, the light source image of a light-emitting surface which has a horizontally elongated shape when viewed in the optical axis direction of the light-emitting system. Further, the shapes and configurations of optical parts such as the reflector and the like are not made complicated since rotationally asymmetric light distribution is obtained around the optical axis.

Thus, a projected pattern appropriate for obtaining a desired light distribution in a vehicular headlamp can be obtained easily from a substantially rectangular pattern.

A light source image having a desired light intensity distribution can be obtained by appropriately designing the shapes of a semiconductor chip, a reflector, and a fluorescent body that together form the light-emitting system.

Particularly, it is possible to form a clear cut line for a low-beam light distribution pattern.

The degree of freedom in designing the light distribution can be improved by using light-emitting system according to distinct light distribution functions.

Overall size reduction can be achieved by arranging a plurality of the semiconductor chips inside one light-emitting system, and a variety of light intensity distributions can be obtained by controlling individually which semiconductor chips are activated to emit light.

It should further be apparent to those skilled in the art that various changes in form and detail of the invention as shown and described above may be made. It is intended that such changes be included within the spirit and scope of the claims appended hereto.

What is claimed is:

1. A vehicular headlamp comprising a light-emitting system comprising at least one semiconductor light-emitting element and an optical system comprising at least one of a reflector and a lens, a focal point of said optical system being on or near a light-emitting surface of said light-emitting system, said light-emitting surface having a horizontally elongated shape in a direction orthogonal to an optical axis of said light-emitting system when viewed in the direction of the optical axis of said light-emitting system, and said optical system forming a light distribution pattern by enlarging a light pattern of said light-emitting surface in a horizontal direction, wherein the light-emitting surface of the light-emitting system has a rotationally asymmetric shape and a straight-line edge, whereby the optical system forms the light distribution pattern with a cut line by projecting the straight-line edge of the light-emitting surface.

2. The vehicular headlamp according to claim 1, wherein said light-emitting surface has a substantially rectangular shape when viewed in said direction of said optical axis.

3. The vehicular headlamp according to claim 1, wherein said light-emitting system comprises a semiconductor chip, a reflector disposed behind and around said semiconductor chip, and a fluorescent body filled around said semiconductor chip.

4. The vehicular headlamp according to claim 2, wherein a side edge portion of a pattern shape of a light source image of said light-emitting system in a longitudinal direction thereof has a shape geometrically similar to a cut line of a low-beam of a headlamp.

5. The vehicular headlamp according to claim 1, wherein said light-emitting system comprises a plurality of semiconductor chips arranged in an array, whereby a rotationally asymmetric light intensity distribution can be obtained around the optical axis of the light-emitting system by selectively causing a plurality or all of said semiconductor chips to radiate light.

6. The vehicular headlamp according to claim 5, wherein said semiconductor chips are arranged in a single line, and further comprising a semi-cylindrical fluorescent member covering said semiconductor chips.

7. The vehicular headlamp according to claim 5, wherein said semiconductor chips are arranged in a rectangular matrix, and said optical system comprises a hemispherical fluorescent member covering said semiconductor chips.

8. The vehicular headlamp according to claim 5, wherein different ones of said semiconductor chips have respectively different shapes so as to produce respective light distribution patterns having differing amounts of diffusion in a horizontal direction, whereby said optical system forms a combined projected light pattern by combining said respective light distribution patterns having differing amounts of diffusion.

9. The vehicular headlamp according to claim 8, wherein selected ones of said semiconductor chips are shaped and arranged to produce a projected light pattern having a cut line for a headlamp low-beam.

10. A vehicular headlamp comprising a light-emitting system comprising a semiconductor light-emitting element and an optical system comprising at least one of a reflector and a lens, a focal point of said optical system being on or near a light-emitting surface of said light-emitting system, said light-emitting surface of said light-emitting system having a rotationally asymmetric shape in a direction orthogonal to an optical axis of said light-emitting system when viewed in the direction of the optical axis of said light-emitting system, and said optical system forming a light distribution pattern by enlarging an image of said light source image, and wherein the light-emitting surface of the light-emitting system has a straight-line edge, whereby the optical system forms the light distribution pattern with a cut line by projecting the straight-line edge of the light-emitting surface.

* * * * *